United States Patent
Hsieh et al.

(10) Patent No.: US 7,651,937 B2
(45) Date of Patent: Jan. 26, 2010

(54) BUMPING PROCESS AND STRUCTURE THEREOF

(75) Inventors: Chueh-An Hsieh, Kaohsiung (TW); Li-Cheng Tai, Kaohsiung (TW); Shyh-Ing Wu, Kaohsiung (TW); Shih-Kuang Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 278 days.

(21) Appl. No.: 11/502,480

(22) Filed: Aug. 11, 2006

(65) Prior Publication Data

US 2007/0049001 A1    Mar. 1, 2007

(30) Foreign Application Priority Data

Aug. 23, 2005 (TW) .............................. 94128820 A (51) Int. Cl.
  *H01L 21/44* (2006.01)
(52) U.S. Cl. .................. 438/613; 438/612; 438/611; 438/672
(58) Field of Classification Search ........... 438/613, 438/614, 672, 611, 615, 612
See application file for complete search history.

(56) References Cited

U.S. PATENT DOCUMENTS

| 5,767,010 | A  | * | 6/1998 | Mis et al. | 438/614 |
| 6,426,556 | B1 | * | 7/2002 | Lin | 257/738 |
| 6,440,836 | B1 | * | 8/2002 | Lu et al. | 438/612 |
| 7,008,867 | B2 | * | 3/2006 | Lei | 438/613 |
| 7,427,557 | B2 | * | 9/2008 | Rinne et al. | 438/612 |

\* cited by examiner

*Primary Examiner*—Chuong A. Luu
(74) *Attorney, Agent, or Firm*—Rabin & Berdo, P.C.

(57) ABSTRACT

A bumping process and a structure thereof are provided. The bumping process includes the following steps. Firstly, a wafer having a number of pads is provided. Next, a UBM layer is formed on the pad. Then, a conductive first photo-resist layer is coated on the wafer to cover the UBM layer. Next, a second photo-resist layer is coated on the first photo-resist layer. Then, at least a portion of the second photo-resist layer is removed to form an opening above the UBM layer. The first photo-resist layer maintains electric connection with the UBM layer. Next, a solder layer is formed in the opening by electroplating process. Then, the first photo-resist layer and the second photo-resist layer are removed expect the portion of the first photo-resist layer under the solder layer.

8 Claims, 9 Drawing Sheets

BUMPING PROCESS AND STRUCTURE THEREOF

This application claims the benefit of Taiwan application Ser. No. 094128820, filed Aug. 23, 2005, the subject matter of which is incorporated herein by reference.

BACKGROUND OF THE INVENTION

1. Field of the Invention

The invention relates in general to a bumping process and a structure thereof, and more particularly to a bumping process and a structure thereof achieved by electroplating process.

2. Description of the Related Art

Along with the rapid advance in science and technology in the semiconductor industry, electronic products incorporating semiconductor components have become indispensable to modern people in their everydayness. In response to the design trend of slimness, light weight and compactness, high density semiconductor packaging technology such as flip-chip package is developed. The flip chip in package manufacturing process possesses the features of excellent electric characteristics, high input/output contact density, reducing the size of IC chip and increasing wafer output, is considered to have great potential. The bump process is crucial to the flip chip in packaging technology.

Referring to FIGS. 1A~1H, a flowchart of a conventional bumping process is shown. Firstly, refer to FIG. 1A, a wafer 10 whose surface has a pad 11 disposed thereon is provided, and there is a passivation layer 20 covering the surface of the pad 11 and the surface of the wafer but exposing a portion of the pad 11. Next, refer to FIG. 1B, a metallurgy layer 30b is deposited. Then, refer to FIG. 1C, a photo-resist layer 40 is coated on the -metallurgy layer 30b. Next, refer to FIG. 1D, the photo-resist layer 40 is patterned and an opening 60 is formed above the pad 11. Then, refer to FIG. 1E, a solder layer 50 is formed in the opening 60 by electroplating process. Next, refer to FIG. 1F, the photo-resist layer 40 is removed to expose the solder layer 50. Then, refer to FIG. 1G, the portion of the metallurgy layer 30b exposed outside the solder layer 50 is etched to form an under-bump metallurgy (UBM) layer 30. During the etching process, the solder layer 50 will be damaged and oxidized, so the oxides formed on the surface of the solder layer 50 need to be detached. Lastly, refer to FIG. 1H, a conductive bump 51 is formed by reflowing process.

Figure 1A:
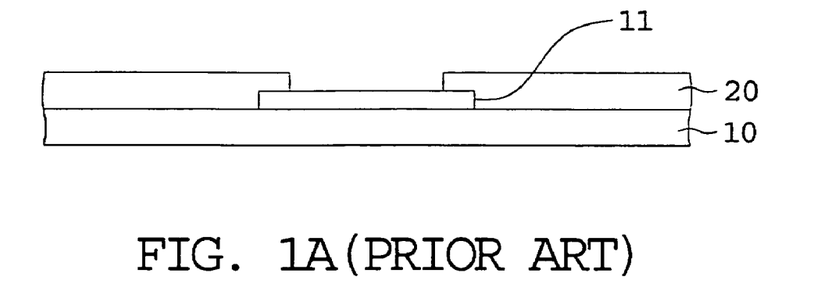
Figure 1B:
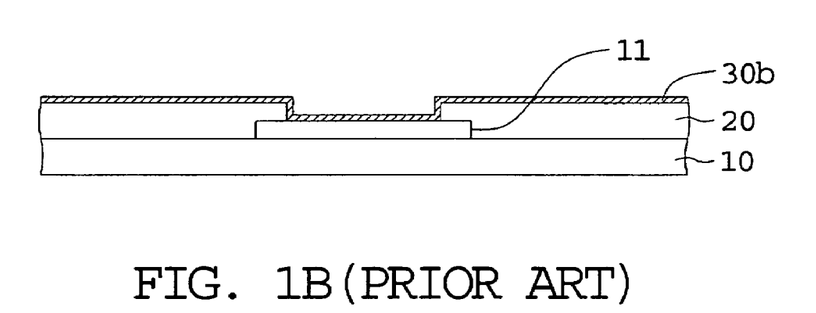
Figure 1C:
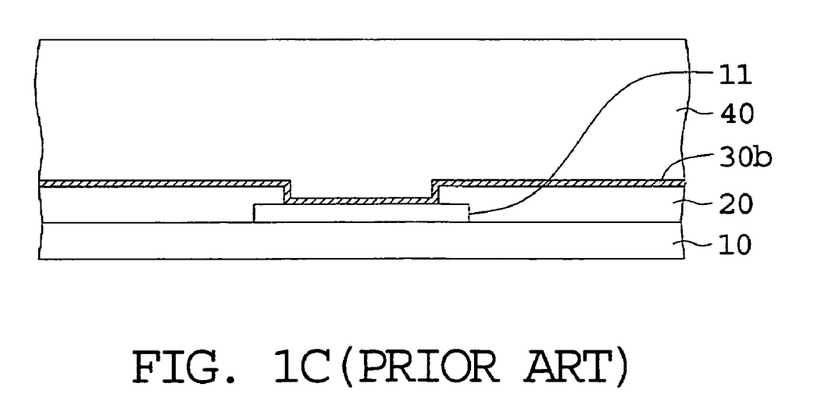
Figure 1D:
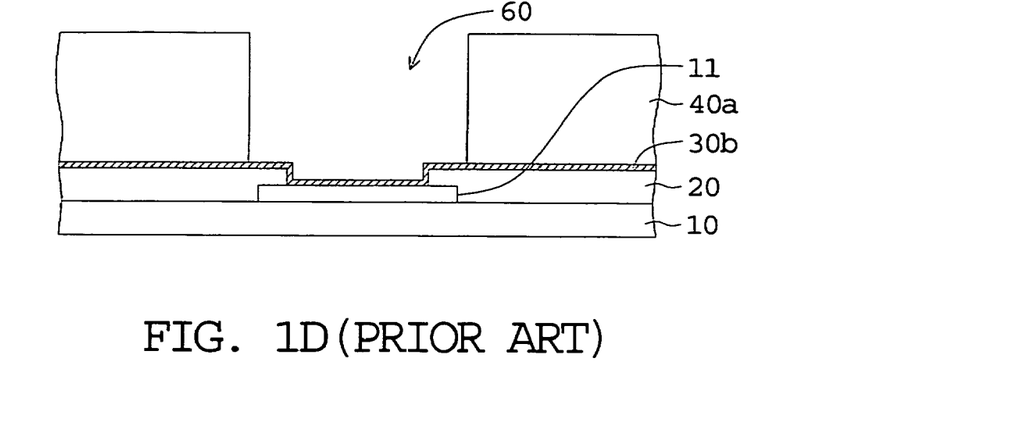
Figure 1E:
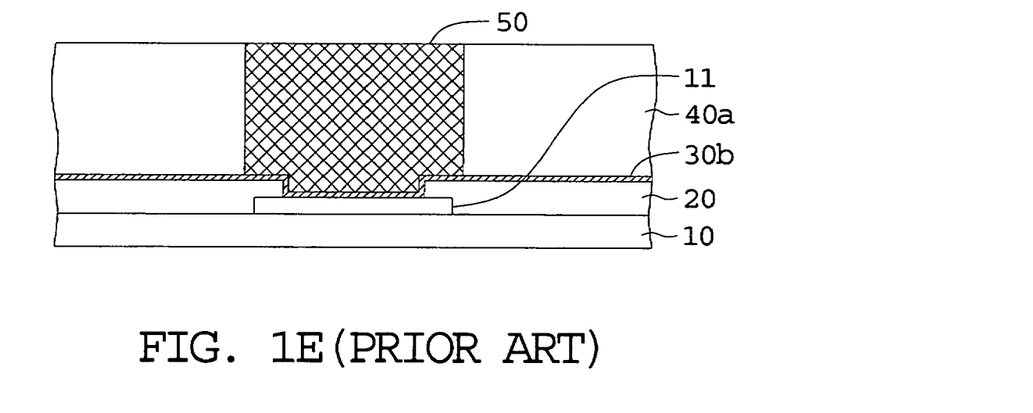
Figure 1F:
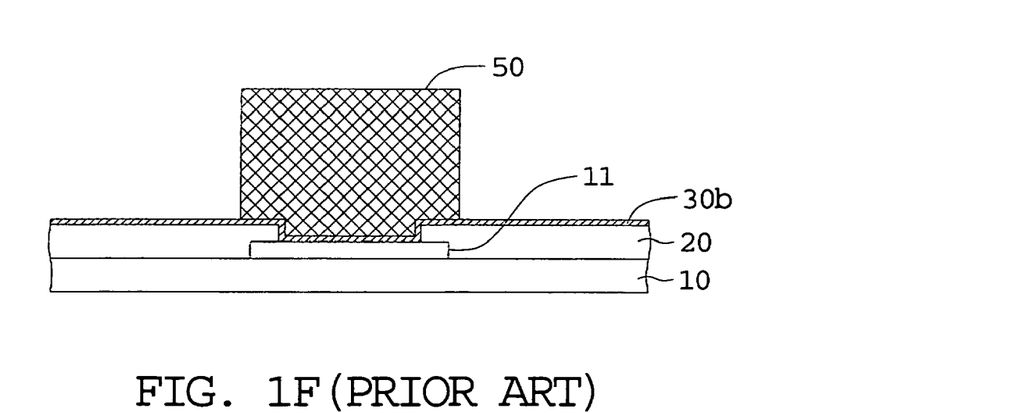
Figure 1G:
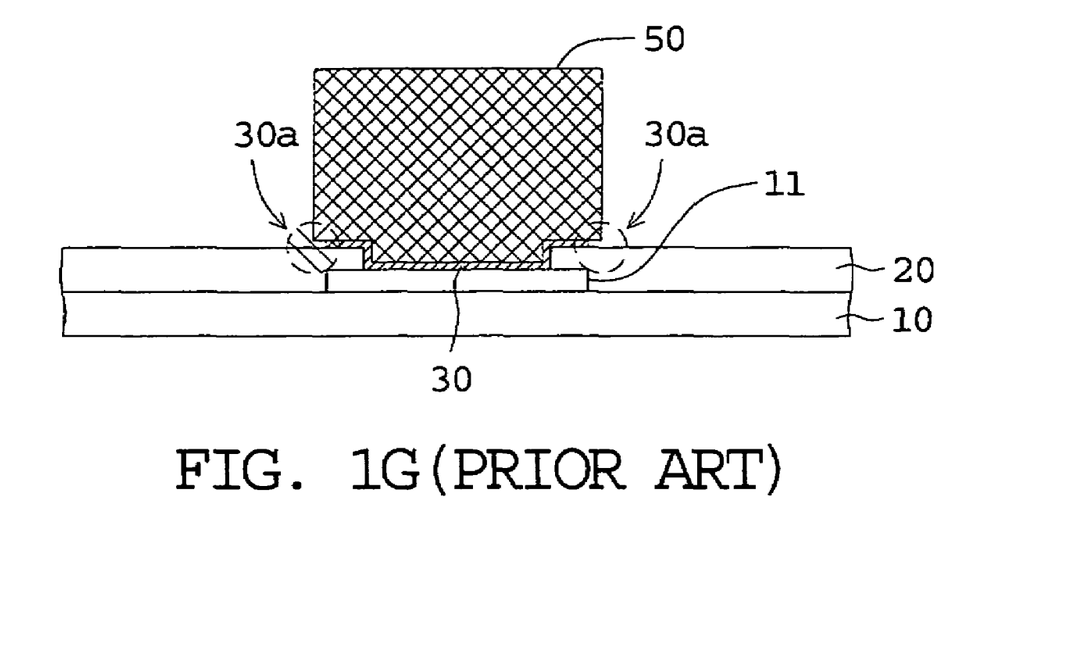
Figure 1H:
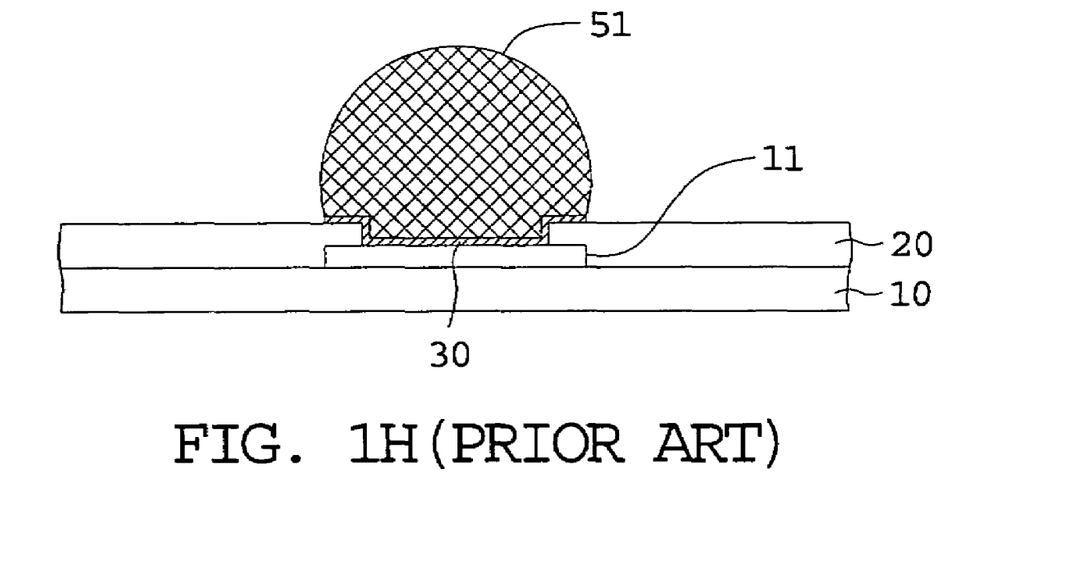

As disclosed above, in FIG. 1G, the etching process removes the metallurgy layer 30b, but the same time etches the surface of the solder layer 50, causing oxides to be formed in the surface of the solder layer 50, making the electric resistance too high. Therefore, a manufacturing process of detaching the oxides has to be added, wasting both the labor and the costs. Furthermore, since the etching direction in the etching process is not consistent, lateral etching 30a will occur to the peripheral of the UBM layer 30 under the solder layer 50, making the solder layer 50 unstable and will break or come off easily. The lateral etching 30a occurs under the solder layer 50 and is hard to be detected, making the quality of the conductive bump 51 unstable.

SUMMARY OF THE INVENTION

It is therefore an object of the invention to provide a bumping process and a structure thereof, dispensing with the manufacturing process of detaching the oxides formed on the surface of the solder layer and avoiding the waste of labor and costs. Furthermore, the lateral etching on the UBM layer is avoided, so the quality of the conductive bump is assured.

The invention achieves the above-identified object by providing a bumping process. The bumping process includes the following steps. Firstly, a wafer having a number of pads is provided. Next, a UBM layer is formed on the pad. Then, a conductive first photo-resist layer is coated on the wafer to cover the UBM layer. Next, a second photo-resist layer is coated on the first photo-resist layer. Then, at least a portion of the second photo-resist layer is removed to form an opening above the UBM layer. The first photo-resist layer maintains electric connection with the UBM layer. Next, a solder layer is formed in the opening by electroplating process. Then, the first photo-resist layer and the second photo-resist layer are removed expect the portion of the first photo-resist layer under the solder layer.

The invention further achieves the above-identified object by providing a conductive bump structure. The conductive bump structure includes a chip, a pad, a passivation layer, a UBM layer, a conductive photo-resist layer and a conductive bump. The pad is disposed on the chip. The passivation layer covers the chip and exposes the pad. The UBM layer is disposed on the pad. The conductive photo-resist layer is disposed on the UBM layer. The conductive bump is disposed on the conductive photo-resist layer.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIGS. 1A~11H are a flowchart of a conventional bumping process;

DETAILED DESCRIPTION OF THE INVENTION

First Embodiment

Referring to FIGS. 2A~2F, a manufacturing flowchart of a patterned UBM layer according to the invention is shown. Firstly, refer to FIG. 2A, a wafer 10 having a number of pads 11 disposed thereon and a non-conductive passivation layer 20 covering the pad 11 and the wafer 10 are provided. A portion of the pad 11 is exposed for electric connection. The internal circuit of the wafer 10 is connected to the outside via the pad 11. Next, refer to FIG. 2B, a metallurgy layer 30b is deposited on the passivation layer 20 and the pad 11 completely. The metallurgy layer 30b which may be formed by sputtering is selected from a group consisting of titanium (Ti), chromium-copper (CrCu), copper (Cu), aluminum (Al), nickel-vanadium (NiV) and the combination thereof. Next, refer to FIG. 2C, a third photo-resist layer 43 is coated on the metallurgy layer 30b. Then, refer to FIG. 2D, the third photo-resist layer 43 is patterned via exposure and developing process to expose the area other than atop the pad 11 to form a patterned third photo-resist layer 43a. Meanwhile, the patterned third photo-resist layer 43a shields the portion of the metallurgy layer 30b above the pad 11. Next, refer to FIG. 2E, with the shielding of the patterned photo-resist layer 43a, the exposed portion of the metallurgy layer 30b is etched and a patterned under-bump metallurgy (UBM) layer 30 is formed above the pad 11. Lastly, refer to FIG. 2F, the patterned third photo-resist layer 43a is removed and the patterned UBM layer 30 is formed. The manufacturing process of patterning the patterned UBM layer 30 is completed.

Referring to FIG. 2G~2L, a flowchart of a bumping process according to a first embodiment of the invention is shown. Firstly, refer to FIG. 2G, a conductive first photo-resist layer 41 is coated on the wafer 10 of FIG. 2F. The first photo-resist layer 41 includes a conductive material.

Figure 2A:
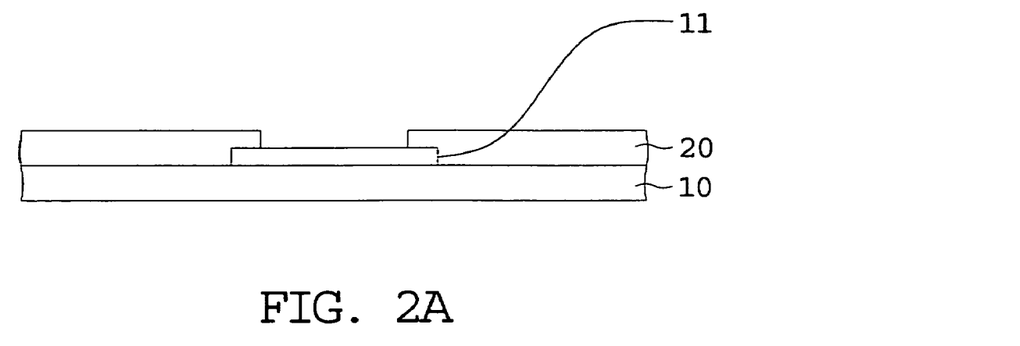
FIGS. 2A~2F are a manufacturing flowchart of a patterned UBM layer according to the invention.
Figure 2B:
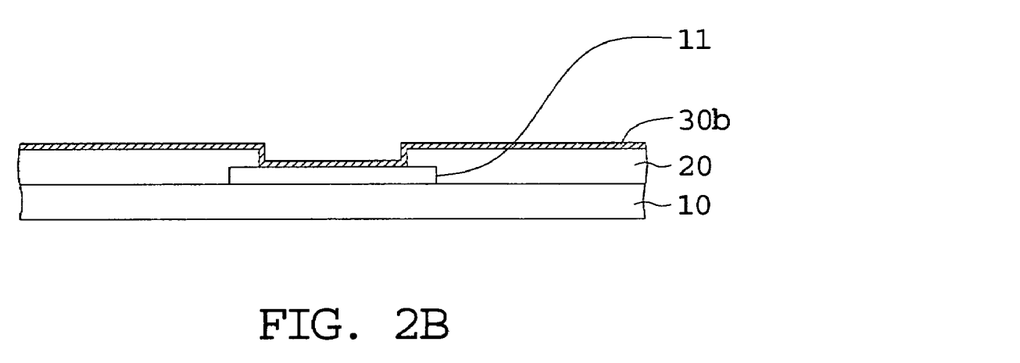
Figure 2C:
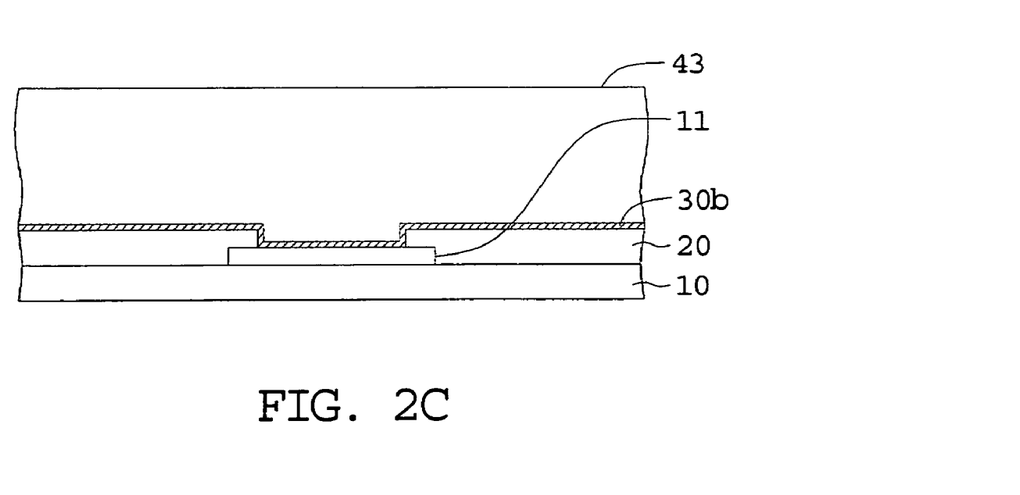
Figure 2D:
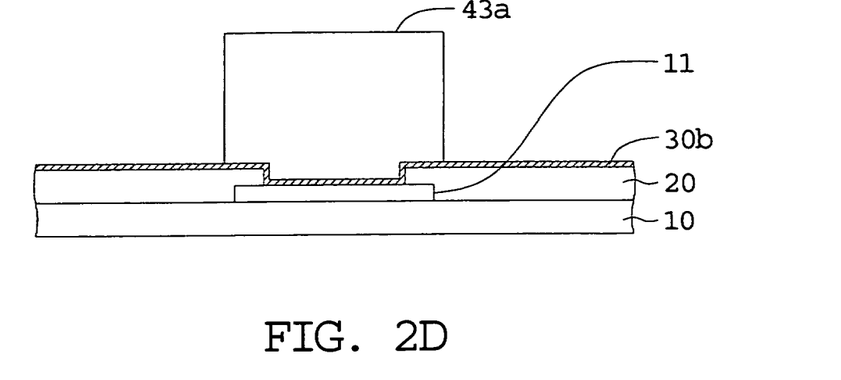
Figure 2E:
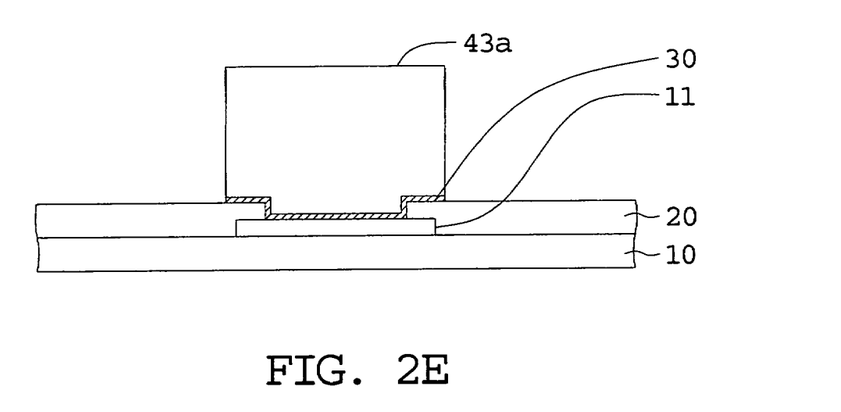
Figure 2F:
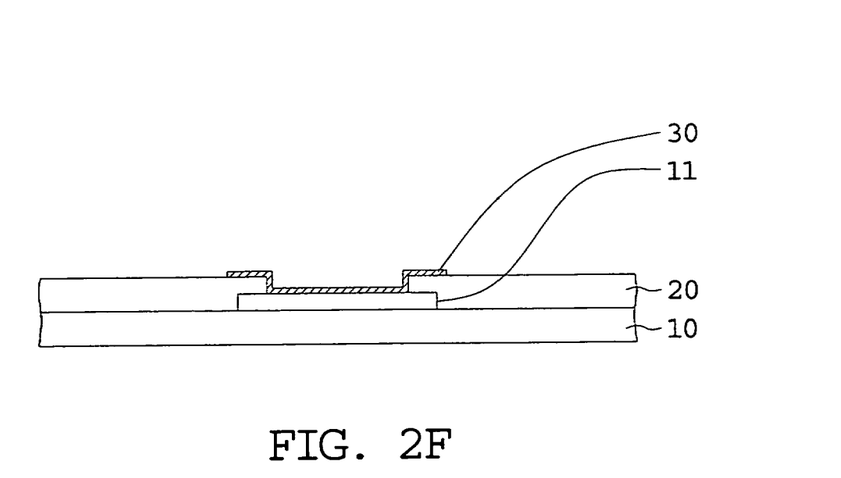
Figure 2G:
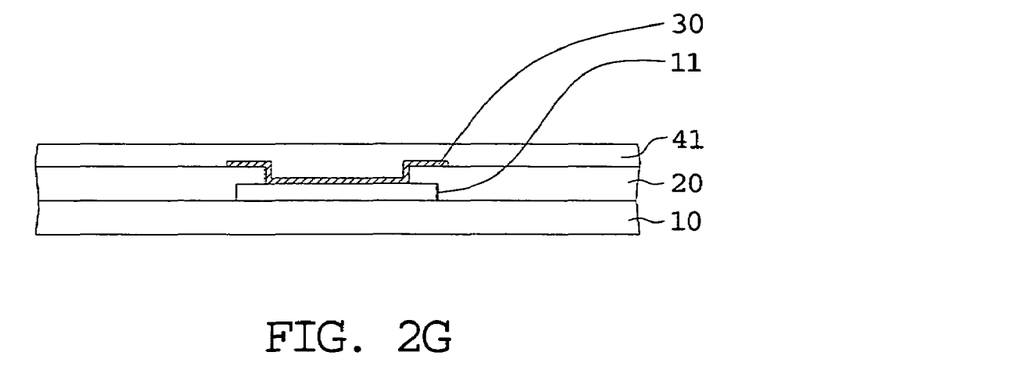
FIGS. 2G~2L are a flowchart of a bumping process according to a first embodiment of the invention.
Figure 2H:
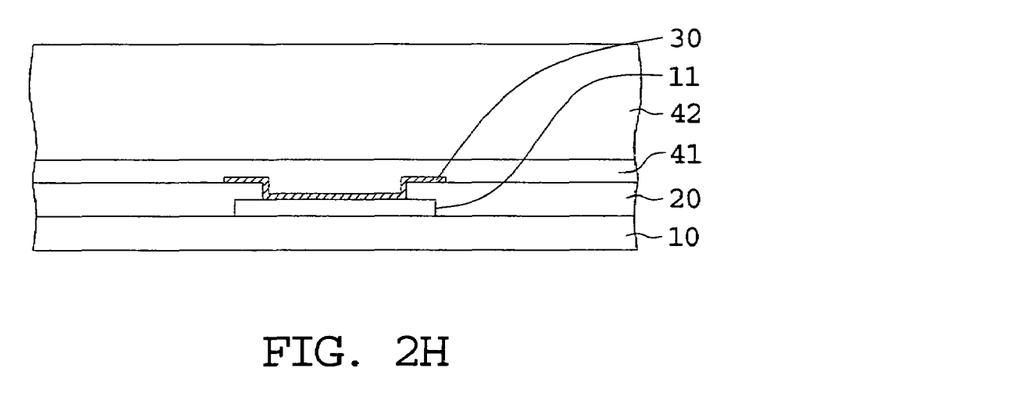
Figure 2I:
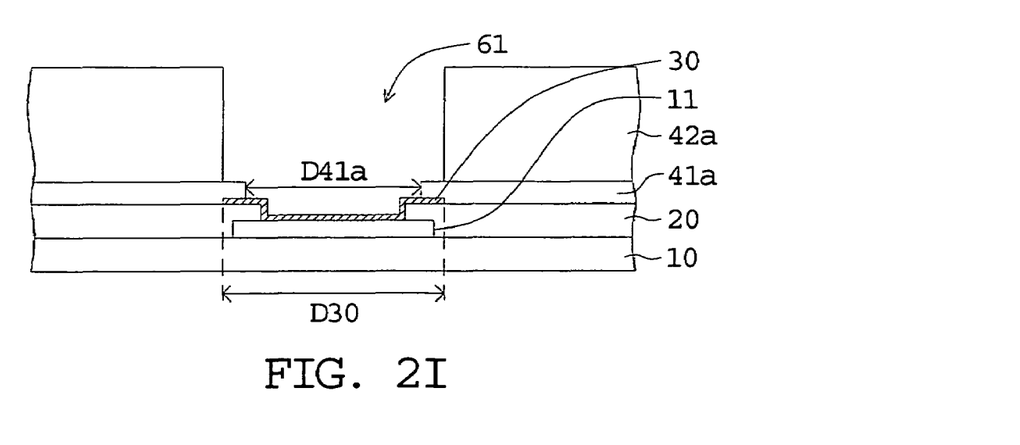

Next, refer to FIG. 2H, a second photo-resist layer 42 is completely coated on the first photo-resist layer 41. The thickness of the second photo-resist layer 42 is approximately the same with the solder layer 50 to be formed. Then, the first photo-resist layer 41 and the second photo-resist layer 42 are patterned via exposure and developing process. Next, refer to FIG. 2I, the portions of the patterned first photo-resist layer 41a and the patterned second photo-resist layer 42a above the UBM layer 30 are exposed to form an opening 61.

Figure 2J:
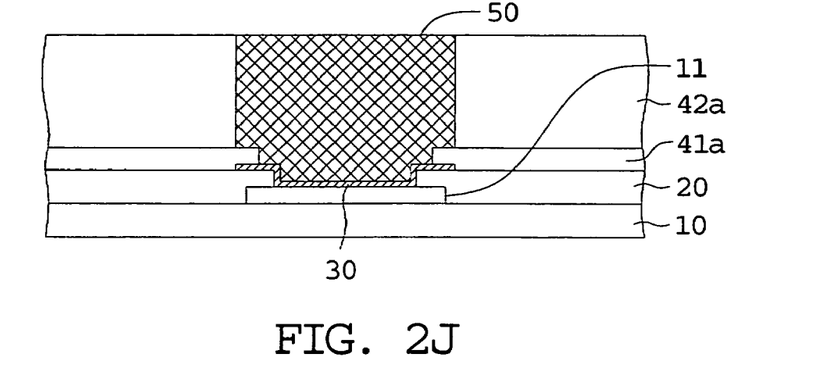

The patterned first photo-resist layer 41a still maintains electric connection with the UBM layer 30. That is, the diameter D41a of the opening of the patterned first photo-resist layer 41a is smaller than the diameter D30 of the UBM layer 30. Refer to FIG. 2J, the patterned first photo-resist layer 41a maintains electric connection with the UBM layer 30, so that a voltage is transmitted to the UBM layer 30 via the patterned first photo-resist layer 41a for electroplating, and that a solder layer 50 is formed in the opening 61. The solder layer 50 is selected from a group consisting of tin (Sn), lead (Pb), silver (Ag), copper (Cu), phosphorus (P), bismuth (Bi), germanium (Ge) and the combination thereof.

Figure 2K:
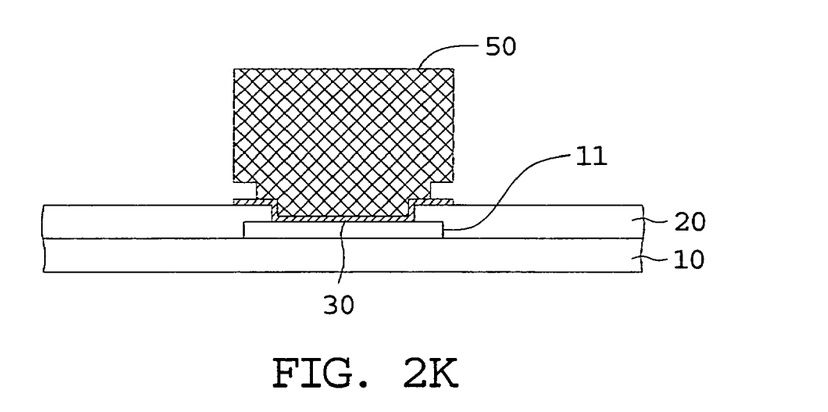
Figure 2L:
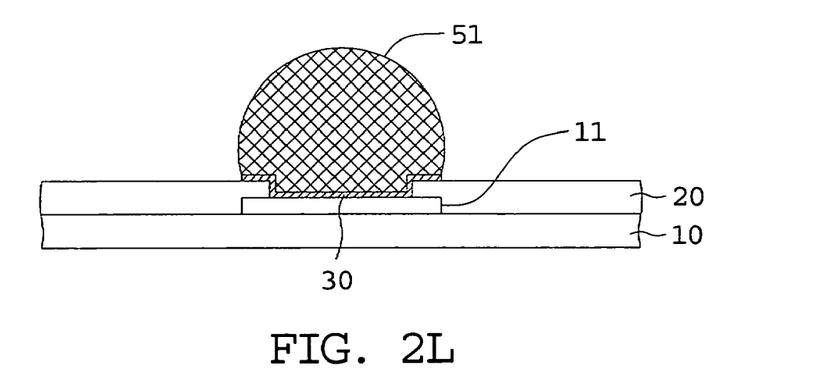

Next, refer to FIG. 2K, the patterned first photo-resist layer 41a and the patterned second photo-resist layer 42a are removed, but the solder layer 50 is left. Then, refer to FIG. 2L, the solder layer 50 is reflown, so that the solder layer 50 becomes spherical due to the surface tension and forms a conductive bump 51. The wafer 10, the pad 11, the UBM layer 30 and the conductive bump 51 are sequentially stacked bottom up. The passivation layer 20 covers the wafer 10 but exposes the pad 11 to be connected with the UBM layer 30. Here, the bumping process from FIG. 2A to FIG. 2L is completed.

Second Embodiment

Referring to both FIGS. 2A~2H and FIGS. 3A~3D. FIGS. 3A~3D are a flowchart of a bumping process according to a second embodiment of the invention. The bumping process of the present embodiment differs with the bumping process of the first embodiment in that during the step of patterning the first photo-resist layer and the second photo-resist layer, only the second photo-resist layer 42 is patterned while the first photo-resist layer 41 is left intact. The other similarities are not repeated.

After the step of FIG. 2H is completed, the second photo-resist layer 42 patterned via exposure and developing process. Next, refer to FIG. 3A, the portion of the second photo-resist layer 42 above the UBM layer 30 is exposed to form a patterned second photo-resist layer 42a and an opening 361 but the first photo-resist layer 41 is left intact.

Figure 3A:
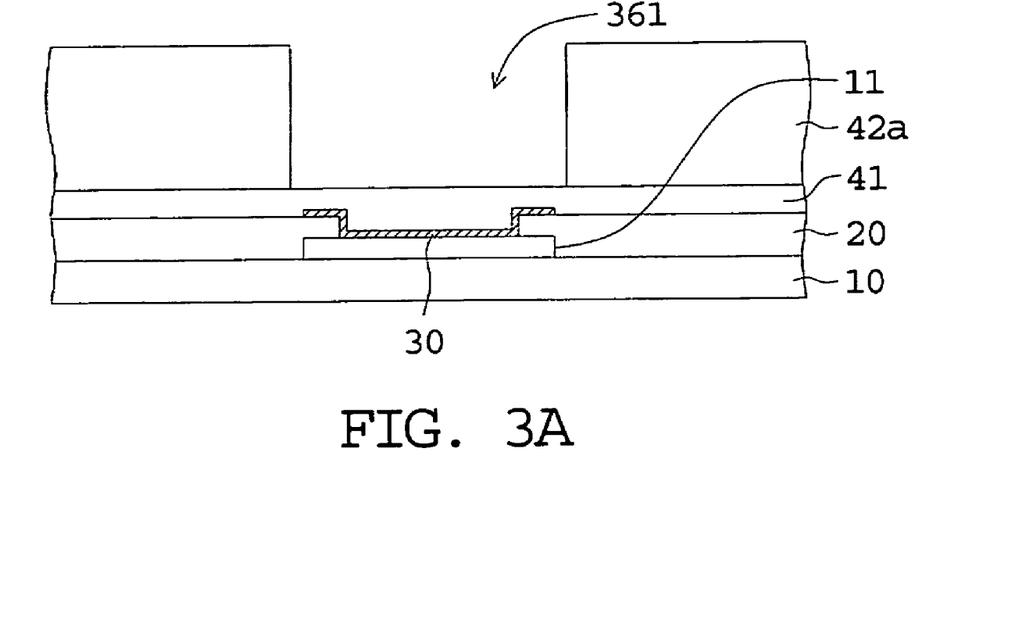
FIGS. 3A~3D are a flowchart of a bumping process according to a second embodiment of the invention.
Figure 3B:
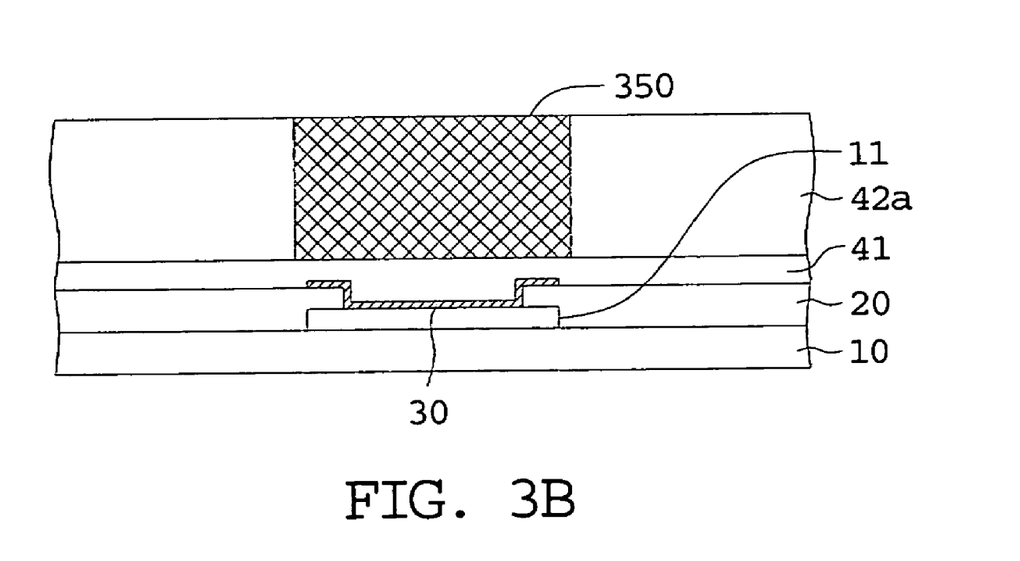

Refer to FIG. 3B, the first photo-resist layer 41 maintains electric connection with the UBM layer 30, so that a voltage is transmitted to the UBM layer 30 via the first photo-resist layer 41 for electroplating and that a solder layer 350 is formed in the opening 361.

Figure 3C:
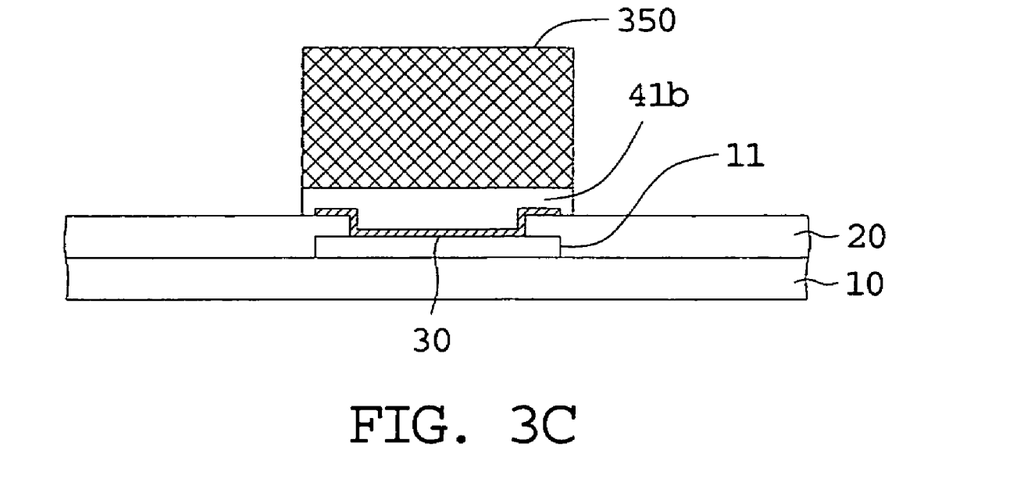

Then, refer to FIG. 3C, the patterned second photo-resist layer 42a and the first photo-resist layer 41 are removed except the portion of the first photo-resist layer 41 under the solder layer 350, that is, only the solder layer 350 and an under-bump first photo-resist layer 41b are left.

Figure 3D:
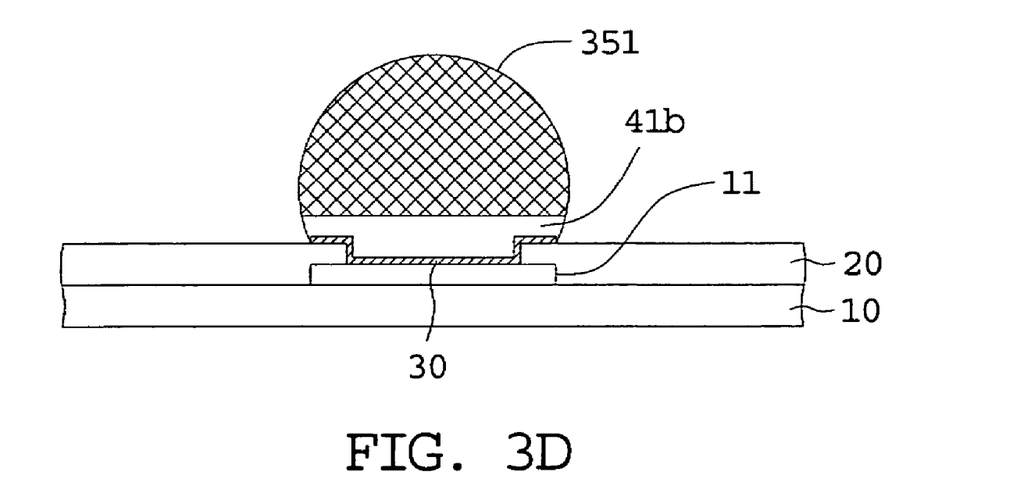

Next, refer to FIG. 3D, the solder layer 350 is reflown, so that the solder layer 350 becomes spherical due to surface tension and forms a bump 351. The wafer 10, the pad 11, the UBM layer 30, the under-bump first photo-resist layer 41b and the conductive bump 351 are sequentially stacked bottom up. The passivation layer 20 covers the wafer 10 and exposes the pad 11 to be connected with the UBM layer 30. Here, the bumping process of FIGS. 2A~2H and FIGS. 3A~3D is completed.

According to the bumping process and the structure thereof disclosed in the above embodiments of the invention, a UBM layer is formed first, and a solder layer is electroplated next via a conductive first photo-resist layer. Therefore, the solder layer will not oxidize during the process of etching the UBM layer, dispensing with the process of detaching the oxides formed on the surface of the solder layer and avoiding the waste of labor and costs. Furthermore, after the solder layer is formed, the UBM layer under the solder layer is not etched, so that the lateral etching on the UBM layer is avoided, and that the quality of the conductive bump is assured.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bumping process of forming a conductive bump on a wafer, comprising:
   providing a wafer having a plurality of pads;
   forming an under-bump metallurgy layer (UBM layer) on the pad;
   coating a conductive first photo-resist layer on the wafer to cover the UBM layer;
   coating a second photo-resist layer on the conductive first photo-resist layer;
   removing at least a portion of the second photo-resist layer to form an opening above the UBM layer, wherein the conductive first photo-resist layer maintains electric connection with the UBM layer;
   forming a solder layer in the opening by electroplating process; and
   removing the conductive first photo-resist layer and the second photo-resist layer expect the portion of the conductive first photo-resist layer under the solder layer.

2. The bumping process according to claim 1, wherein in the step of removing at least a portion of the second photo-resist layer, a portion of the conductive first photo-resist layer and a portion of the second photo-resist layer are removed to form the opening to expose the UBM layer.

3. The bumping process according to claim 1, wherein in the step of removing at least a portion of the second photo-resist layer, only a portion of the second photo-resist layer is removed to form the opening, but the conductive first photo-resist layer is left.

4. The bumping process according to claim 1, wherein in the step of forming a solder layer by electroplating process, a voltage is transmitted to the UBM layer for electroplating via the conductive first photo-resist layer.

5. The bumping process according to claim 1, further comprising:
   forming a conductive bump by reflowing process.

6. The bumping process according to claim 1, wherein the step of forming the UBM layer further comprises:
   depositing a metallurgy layer to cover the surface of the wafer completely;

coating a third photo-resist layer on the metallurgy layer;
patterning the third photo-resist layer to expose a portion of the metallurgy layer;
etching the exposed portion of the metallurgy layer to form a patterned UBM layer; and
removing the third photo-resist layer.

7. The bumping process according to claim 1, wherein the UBM layer is selected from a group consisting of titanium (Ti), chromium-copper (CrCu), copper (Cu), aluminum (Al), nickel-vanadium (NiV) and the combination thereof.

8. The bumping process according to claim 1, wherein the solder layer is selected from a group consisting of tin (Sn), lead (Pb), silver (Ag), copper (Cu), phosphorus (P), bismuth (Bi), germanium (Ge) and the combination thereof.

* * * * *

UNITED STATES PATENT AND TRADEMARK OFFICE
CERTIFICATE OF CORRECTION

PATENT NO.       : 7,651,937 B2
APPLICATION NO.  : 11/502480
DATED            : January 26, 2010
INVENTOR(S)      : Hsieh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 446 days.

Signed and Sealed this

Twenty-third Day of November, 2010

David J. Kappos
*Director of the United States Patent and Trademark Office*